United States Patent [19]

Eisenhart

[11] Patent Number: 4,588,963

[45] Date of Patent: May 13, 1986

[54] MICROWAVE POWER COMBINER WITH ALTERNATING DIODE MODULES

[75] Inventor: Robert L. Eisenhart, Woodland Hills, Calif.

[73] Assignee: Hughes Aircraft Company, Los Angeles, Calif.

[21] Appl. No.: 564,787

[22] Filed: Dec. 20, 1983

[51] Int. Cl.[4] .............................................. H03B 5/00
[52] U.S. Cl. ....................................... 331/56; 331/101;
  331/107 P; 331/107 C; 333/230
[58] Field of Search ..................... 331/56, 101, 107 P, 331/107 C; 330/56; 333/229, 230

[56] References Cited

U.S. PATENT DOCUMENTS

| | | | |
|---|---|---|---|
| 3,628,171 | 12/1971 | Kurokawa et al. | 331/96 |
| 3,783,401 | 1/1974 | Oltman, Jr. | 330/56 |
| 3,931,587 | 1/1976 | Harp et al. | 331/56 |
| 4,097,817 | 6/1978 | Thoren et al. | 331/56 |
| 4,097,821 | 6/1978 | Lampen et al. | 331/101 |
| 4,121,174 | 10/1978 | Aston | 331/48 |
| 4,130,810 | 12/1978 | Wallace | 331/107 |
| 4,143,334 | 3/1979 | Dydyk | 331/56 |
| 4,147,994 | 4/1979 | Thoren et al. | 331/56 |
| 4,162,458 | 7/1979 | Dydyk et al. | 331/56 |
| 4,172,240 | 10/1979 | Jerinic | 331/56 |
| 4,175,257 | 11/1979 | Smith et al. | 330/287 |
| 4,189,683 | 2/1980 | Fassett et al. | 330/287 |
| 4,189,684 | 2/1980 | Hieber et al. | 331/56 |
| 4,468,633 | 8/1984 | Chilluffo et al. | 331/56 |
| 4,470,021 | 9/1984 | Laton | 331/56 |

FOREIGN PATENT DOCUMENTS 0133880  1/1979  Fed. Rep. of Germany ... 331/107 P

Primary Examiner—Eugene R. LaRoche
Assistant Examiner—Robert J. Pascal
Attorney, Agent, or Firm—Thomas A. Runk; Anthony W. Karambelas

[57] ABSTRACT

A solid state microwave power combiner is disclosed having a central combining cavity with a plurality of coaxial oscillator circuits disposed about and coupled to the cavity. The oscillator circuits are oriented such that their longitudinal axes are parallel with the central axis of the combining cavity. They alternate in configuration about the cavity such that adjacent oscillator circuits have their power generating diodes located on opposite sides of the cavity. In one embodiment, the coaxial lines used in the oscillator circuits have two parts of different sizes. The oscillator circuits are oriented about the cavity so that the smaller sized coaxial line part of one is adjacent the larger sized coaxial line part of the next. Both rectangular and circular combining cavities are disclosed.

20 Claims, 4 Drawing Figures

MICROWAVE POWER COMBINER WITH ALTERNATING DIODE MODULES

BACKGROUND OF THE INVENTION

The invention relates generally to solid state power sources, and more particularly, to a microwave power source which combines multiple solid state power generating circuits in a central combining cavity.

Research has been conducted towards the goal of maintaining the excellent performance, reliability and durability of solid state microwave power sources while increasing their power output. Prior techiques include combining multiple microwave power sources in a cavity. One technique feeds the combining cavity with the power outputs of a plurality of solid state, negative resistance oscillator circuits which are disposed near the periphery of the cavity. The number of oscillator circuits which can be coupled to the cavity near its periphery is determined by the length of that periphery and the size of the coupling port of the oscillator circuit. Consequently, the amount of output power from the cavity is limited since the number of oscillator circuits contributing to that power is limited.

Various techniques have been developed in attempts to generate higher power levels in a cavity power combiner including increasing the cavity size. However, where the periphery of the cavity is increased to accommodate a larger number of oscillator circuits, oscillation at undesirable higher order modes would be supported with a corresponding dissipation of microwave power and possible instability in operation. Some of these techiques are shown in U.S. Pat. Nos. 4,189,684; 4,172,240 and 4,097,817.

The above techniques purportedly enable the generation of increased microwave power from a solid state type power combiner, however the dissipation of the heat which is also generated by the oscillator circuits, is not satisfactorily addressed. The heat must be dissipated in order to preserve the reliability of the solid state device and where overall size and weight of the power combiner are primary considerations, the heat dissipation equipment must be kept small and light. External fluid cooling systems have been used, however, they are typically bulky and add a significant amount of weight and size to the power combiner. Adding a heat sink to the power combiner also increases weight and size.

SUMMARY OF THE INVENTION

It is purpose of the invention to overcome most, if not all, of the above-described disadvantages of prior techniques by providing a cavity-type, solid state power source having reduced weight and having more efficient heat dissipation.

It is also a purpose of the invention to provide a microwave power source where the combining cavity is of a size which functions as a fundamental mode resonator and which does not lend itself to supporting higher order mode oscillations.

It is also a purpose of the invention to provide a microwave power combiner which efficiently combines in a central cavity, the individual outputs of a plurality of solid state oscillator circuits.

It is also a purpose of the invention to provide a microwave power combiner having a construction permitting high packing density of oscillator circuits without increasing central cavity size and without increasing overall combiner size.

It is also a purpose of the invention to provide a microwave power combiner which is reliable, durable and is relatively easy to manufacture.

The invention accomplishes the above and other purposes by providing a microwave solid state power combiner which has multiple oscillator circuits coupled to a central combining cavity in a configuration such that heat generated by the oscillator circuits is more evenly distributed in the power combiner and the thermal concentration around the oscillator circuits is reduced. Another advantage of the disclosed configuration is that more of these circuits can be combined without increasing cavity size.

Each oscillator circuit contains a coaxial line length within which is located the power generating diode, associated biasing circuitry, matching devices and a coupling port which couples the power generating diode to the cavity. The coaxial lines are oriented such that their longitudinal axes are parallel to the central axis of the combining cavity. In one embodiment, the outer dimension of the part of the coaxial line which houses the power generating diode and the coupling port is larger than the outer dimension of the remainder of the coaxial line. By alternating adjacent oscillator circuits so that the larger outer dimension part of one coaxial oscillator circuit is adjacent the smaller outer dimension part of the next, the oscillator circuits can be located closer together for coupling to the cavity. This configuration of oscillator circuits about the cavity results in one-half the power generating diodes being located on one side of the cavity and one-half the power generating diodes being located on the other side of the cavity. Thus, generated heat is less of a problem since it is more evenly distributed in the combiner. This arrangement permits cooler operation of the combiner with a given number of oscillator circuits and, if desired, permits combining more oscillator circuits in the combining cavity since electrically adjacent oscillator circuits can be located closer together.

BRIEF DESCRIPTION OF THE DRAWINGS

For a more complete understanding of the invention as well as further purposes and advantages thereof, reference is now made to the accompanying drawings, wherein.

DETAILED DESCRIPTION OF THE INVENTION

Figure 1:
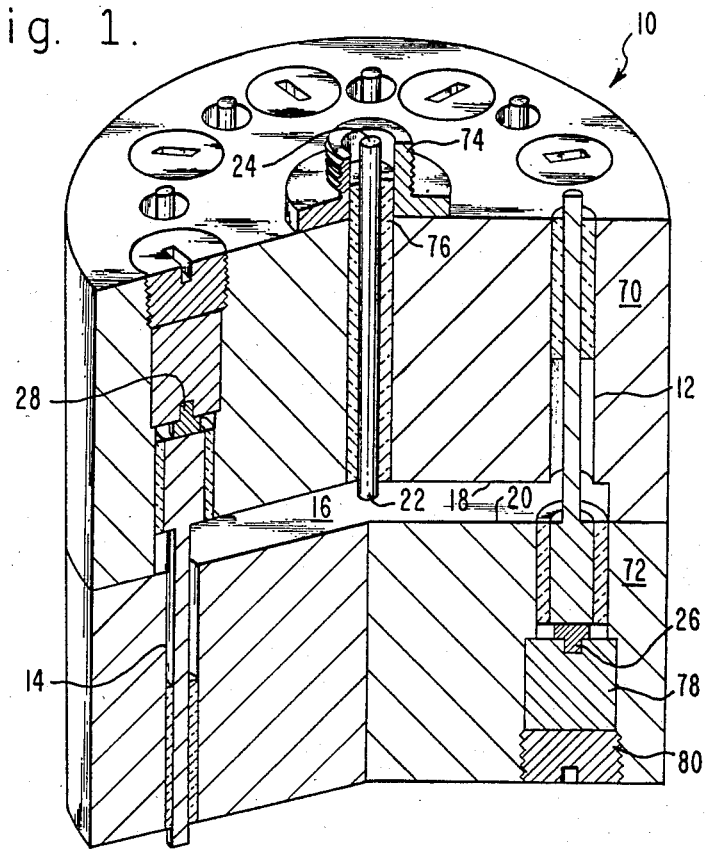
FIG. 1 is partially cut-away, perspective view of an embodiment of a solid state power combiner constructed in accordance with the invention.

In the following description, like reference numerals are used to refer to like elements in the different figures. Referring with more particularity to FIG. 1, there is shown a solid state microwave power combiner 10 in accordance with the invention. A plurality of oscillator circuits, two of which are sectionally shown and are numbered 12 and 14, are located on the periphery of and are electrically coupled to a cylindrically shaped, central combining cavity 16. As shown in FIG. 1, the cylindrical combining cavity 16 has a top wall 18 and a bottom wall 20. Power is coupled into and out of the combining cavity 16 by port 22, which is shown here for example purposes only, as a coaxial connector having its center conductor 24 protruding into the combining cavity 16 through the top wall 18. The oscillator circuits are oriented in relation to the combining cavity 16 such that their longitudinal axes are parallel to the central axis of the combining cavity. Also, the oscillator circuits are configured about the combining cavity 16 so that adjacent oscillator circuits have their power generating devices disposed on opposite sides of the combining cavity 16, i.e., the side defined by the top wall 18 of the cavity 16 and the side defined by the bottom wall 20. As shown in FIG. 1, the oscillator circuit 12 has a power generating device 26 disposed on the bottom wall 20 side of the combining cavity 16 while the oscillator circuit 14 has a power generating device 28 disposed on the top wall 18 side.

Figure 2:
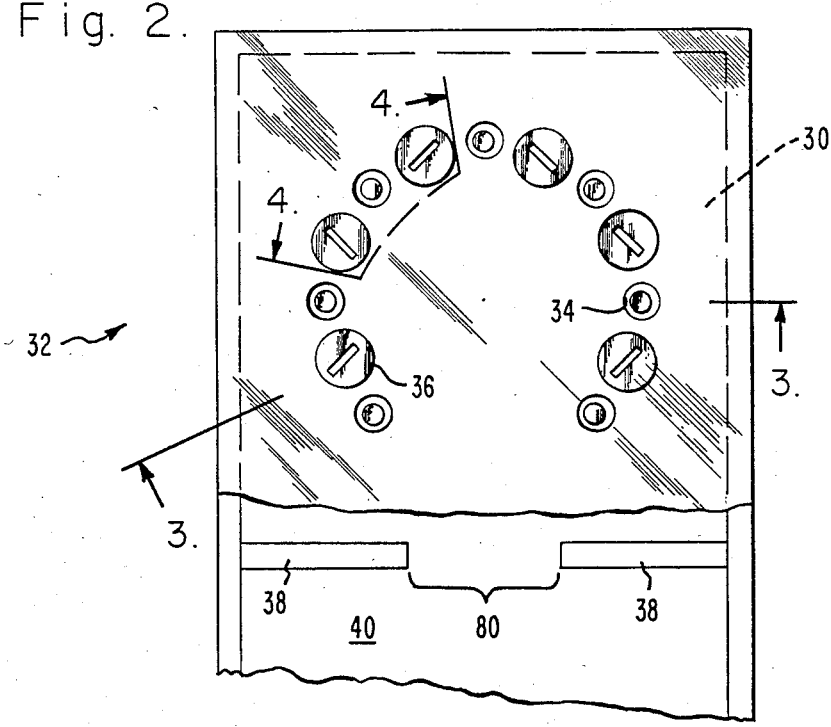
FIG. 2 is a partially cutaway top view of another embodiment of a solid state power combiner constructed in accordance with the invention.

A different embodiment is shown in FIG. 2 where there is also an alternating configuration of oscillator circuits about a combining cavity 30. The power combiner 32 has the central combining cavity 30 which is square in this example and is indicated in dashed lines. In addition to the square shape shown in FIG. 2, the combining cavity may be other rectangular shapes as well, and shapes other than rectangular. The plurality of coaxial oscillator circuits, two of which are referred to by the numerals 34 and 36, are located on an equipotential line of the square combining cavity 30 and are electrically coupled thereto. The combining cavity 30 shown in FIG. 2 is aperture coupled by an iris 38 into a rectangular waveguide 40, whereas the combining cavity 16 shown in FIG. 1 is probe coupled by the center conductor 24 of the coaxial connector. It has been found that the embodiment shown in FIG. 2 permits working at higher power levels than the embodiment shown in FIG. 1, due to the potential for field breakdown or arcing of the probe 24 at higher power levels.

Figure 3:
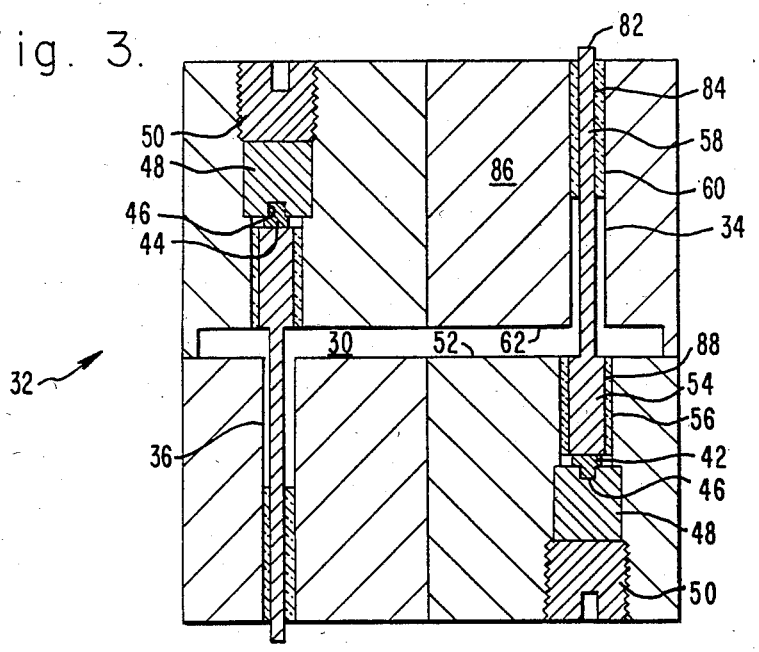
FIG. 3 is a side sectional view taken along the section lines 3—3 indicated in FIG. 2.

FIG. 3 is a side sectional view taken along section 3—3 of FIG. 2 and shows an arrangement usable in the invention. A negative resistance oscillating diode such as an impact avalanche transit time (IMPATT) diode or Gunn diode is usable in the invention. Two of such negative resistance diodes 42 and 44 are shown in the two sectional views of the coaxial oscillator circuits 34 and 36, respectively. The diodes 42 and 44 are located at one end of the coaxial lines 34 and 36 respectively and are held in place by soldering, cementing or other means known by those skilled in the art. As shown in FIG. 3, sockets 46 for mounting the diodes 42 and 44 have been formed in the metallic members 48 which are held in place by screws 50.

As shown in FIG. 3, the part of the coaxial line 34 located on the bottom wall 52 side of the cavity 30 and containing the diode 42, has a larger diameter of both center conductor 54 and outer conductor 56 than the diameters of the center conductor 58 and the outer conductor 60 of the remaining part of the coaxial line 34. The outer conductor of the coaxial lines is the material of the combiner 32 itself. The reduction of the outer diameter along a part of the coaxial lines allows closer placement of adjacent oscillator circuits around the combining cavity 30, when they are oriented as shown in the drawings. The power generating diodes with their associated larger outer diameter coaxial lines are alternated on opposite sides of the central combining cavity 30. The sides of the combining cavity 30 are defined for purposes of this discussion, by the walls, i.e., the top wall 62 and the bottom wall 52. Thus, in FIG. 3, diode 42 is disposed on the bottom wall side of the combining cavity 30 and diode 44 is disposed on the top wall side of the combining cavity 30. Section 4—4 of FIG. 2 is shown in FIG. 4 for a graphic representation of adjacent oscillator circuit orientation shown in FIG. 2.

Figure 4:
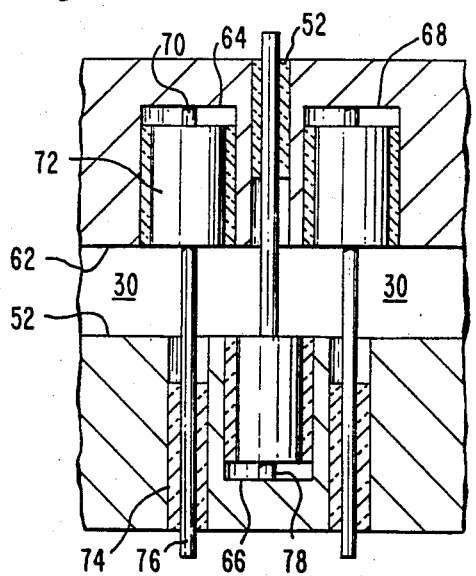
FIG. 4 is an unfolded side sectional view taken along the section lines 4—4 indicated in FIG. 2.

In FIG. 4, the section 4—4 of FIG. 2 has been unfolded for a linear view of the relationships between adjacent oscillator circuits about the combining cavity 30. The oscillator circuits 64, 66 and 68 are adjacent one another with oscillator circuit 66 lying between the other two. As shown, the coaxial oscillator circuits alternate in configuration about the combining cavity 30 from one to the next, where the larger diameter part of the coaxial line of one is adjacent the smaller diameter part of the coaxial line of the next. However, all the oscillator circuits are electrically coupled to the central combining cavity 30. By the technique linearly shown in FIG. 4, more oscillator circuits can be coupled to the central combining cavity 30 and more power can be combined for a greater power output.

In particular, the central combining cavity 30 has a top wall 62 and a bottom wall 52. The coaxial oscillator circuits 64, 66 and 68 all have a linear coaxial line length, part of which includes the power generating device at one end, e.g., diode 70, and a center conductor coupled to that device, e.g., 72. The remaining part of the coaxial line is used for biasing and has a reduced outer dimension 74 and a reduced dimension center conductor 76. The left hand coaxial oscillator circuit 64 shown in FIG. 4 is oriented such that the larger part of the coaxial line which contains the power generating device, is located on the top wall 62 side of the combining cavity 30. The adjacent (center) oscillator circuit 66, however, is oriented so that the larger part of its coaxial line which contains the power generating diode 78, is located on the bottom wall 52 side of the combining cavity 30. The right hand oscillator circuit 68, is oriented as is the left hand oscillator circuit 64, i.e., its power generating device is placed on the top wall 62 side of the combining cavity 30. Thus, by the above-described alternating orientation, the larger diameter part of one coaxial oscillator circuit is next to the smaller diameter part of the adjacent coaxial oscillator circuit.

A result of this orientation is that the individual power and heat generating diodes of adjacent oscillator circuits are located on opposite sides of the combining cavity and so are physically separated from each other by a relatively large distance. The closest power generating device on the same side of the combining cavity is located in the second oscillator circuit away. This alternating orientation results in one-half of the power and heat generating diodes being located on one side of the combining cavity and the other one-half being located on the other side. Thus, there is less thermal concentration around each power generating diode and more even heat loading on the combiner. Reliability is improved due to the reduced thermal concentration around each power generating diode. While the same amount of power is generated as in prior combiners having the same number of power generating diodes, the invention results in cooler operation around each power generating diode, thus the diodes operate at a reduced temperature. If more power out of the same cavity is desired, more oscillator circuits can be coupled to the cavity by locating them closer together in the alternating configuration discussed above.

Referring now back to FIGS. 1 and 3, the central combining cavities 16 and 30, respectively, are dimensioned to support the fundamental mode at the desired operating frequency band. On equi-potential lines of the combining cavities are located a plurality of coaxial oscillator circuits containing the oscillator diodes. These coaxial circuits may be formed by boring respective holes in respective parts of the power combiner so that when assembled, the respective holes are aligned. In FIGS. 1 and 3, the power combiners are formed of two main metallic plates, an upper plate and a lower plate.

In FIG. 1, the input/output port 22 feeds the central combining cavity 16 such as by introducing injection locking signals to the diodes through the port and by outputting the combined power. The coaxial connector 74 is shown attached to the upper plate 70 of the combiner so that its outer conductor is electrically coupled to the upper plate 70. The center probe 24 protrudes through the input/output port 22 into the combining cavity 16 and a dielectric insulation 76 isolates the center conductor 24 from electrical contact with the metallic upper plate 70 and the connector outer conductor. The lower plate 72 forms a part of the combining cavity 16 and houses a part of the oscillator circuits. In FIG. 2, the input/output port 80 feeds the combining cavity 30 and its size is adjusted by the iris 38.

As discussed, the outer conductor of the coaxial line can be formed in the metallic upper and lower combiner plates by boring completely through as shown in FIG. 1 and FIG. 3. In FIG. 1, the power generating diode 26 is supported by a metallic member 78 which is held in place by a metallic screw 80. In FIG. 3, the same mounting configuration is shown having sockets 46, metallic members 48 and screws 50. Another mounting method is shown in FIG. 4, where the diode 70 is not mounted in a socket but is mounted at the end of the coaxial line length 64. The above-described methods, as well as others which may become apparent to those skilled in the art, will suitably support the coaxial oscillator circuits for use in the invention. The method shown in FIGS. 1 and 3 provides easy access by way of the screw.

In FIG. 3, the center conductor 58 of the coaxial line 34 linearly extends from a position external to the power combiner 32 into contact with the larger center conductor 54 which contacts the power generating diode 42. The larger center conductor 54 is also linear and is an impedance matching section for matching the relatively low impedance of the diode 42 to the relatively high impedance of the combining cavity 30. As shown in FIGS. 1, 3 and 4, the impedance matching section which contacts the power generating device (e.g. larger center conductor 72 in FIG. 4), does not extend into the combining cavity. By not extending this section into the cavity, adjacent oscillator circuits may be placed closer together to achieve a denser packing. However, even in the case where the matching section is extended into the cavity, a close packing of adjacent oscillator circuits is still possible. The reduced outer diameter of part of the coaxial line of one oscillator circuit is still adjacent the larger outer diameter of part of the coaxial line of the adjacent oscillator circuits. While the oscillator circuits cannot be located together as closely as in the case where the matching sections do not enter the combining cavity, close packing is still possible.

The center conductors 54 and 58 may be made of one rod as shown in FIG. 3 or they may be separately formed devices which are in electrical and mechanical contact with each other. The use of linear center conductors rather than angled center conductors is advantageous in that they are more easily manufactured and assembly of the combiner is simpler and easier. Also, linear center conductors are more accurately and more easily positioned than are angled center conductors. They are also used to conduct bias current to the diode 42. A bias power source (not shown) is connected at the external end 82 of the center conductor 58. RF load material 84 is placed around the center conductor 58 to support it and electrically isolate it from the outer conductor 60. A suitable RF load material is a lossy substance such as ferrite. It has been found that a ferrite loaded epoxy such as MF 124 by Emerson & Cuming, Canton, Mass., is usable. This material will also serve to suppress oscillation, spurious resonance and harmonics of the oscillator circuit which may be reflected through the coaxial oscillator circuit 34.

A support dielectric surrounds the larger center conductor which contacts the power generating diode. As shown in FIG. 3, this support dielectric 88 surrounds the larger center conductor 54, is coextensive with it, and isolates the center conductor 54 from the outer conductor 56. A low loss dielectric substance such as a plastic is usable.

Thus, there has been shown and described a new and useful microwave power combiner. Heat dissipation is improved due to the more even distribution of the heat generating devices in the body of the power combiner. Heat sources are now separated from each other by the non-heat generating portion of the adjacent oscillator circuits. Thus there is less thermal concentration around each oscillator and cooler operation results. Also, in regard to the disclosed configuration of the oscillator circuits in relation to the central combining cavity, more can be accommodated in the same size cavity without increasing the overall power combiner size. The number of oscillators which can be coupled to the cavity is limited by the outside diameters of the oscillator circuits and the cavity. In the invention, the outside diameter of the oscillator circuits has been reduced over part of the circuit thus permitting denser packing of oscillator circuits.

Although the invention has been described and illustrated in detail, it is anticipated that modifications and variations may occur to those skilled in the art which do not depart from the inventive concepts. It is intended that the invention be limited only by the scope of the claims, not by the description, and so the invention will include such modifications and variations unless the claims limit the invention otherwise.

What is claimed is:

1. A microwave power combiner comprising:
    a fundamental mode combining cavity defined by top and bottom walls and a periphery and having a central axis at the center of the periphery;
    at least three coaxial oscillator circuits, each circuit comprising an oscillator diode and a coupling port coupled to the oscillator diode, the oscillator circuits disposed on an equi-potential line of the cavity and disposed such that the coupling port of each oscillator circuit electrically couples with the cavity, and the individual coaxial oscillator circuits of the plurality are further disposed such that the adjacent oscillator circuits on the equi-potential line have their respective oscillator diode disposed in a different one of the top and bottom walls; and output means for conducting the power combined in the cavity out of the cavity.

2. The power combiner of claim 1 wherein the central axes of the coaxial oscillator circuits are parallel to the central axis of the cavity.

3. The power combiner of claim 2 wherein the cavity is cylindrical in shape and the plurality of oscillator circuits are disposed around and electrically coupled to the periphery of the cavity.

4. The power combiner of claim 2 wherein the walls and periphery of the cavity define a volume having a predetermined resonance, and the resonance controls the frequency band of oscillation of the oscillator circuits.

5. The power combiner of claim 3 wherein the output means is centrally located in one of the walls of the cavity 6. The power combiner of claim 2 wherein the cavity is rectangular in shape and the plurality of oscillator circuits is disposed on an equi-potential line of the cavity.

7. The power combiner of claim 6 wherein the output means comprises an aperture disposed in the periphery of the cavity.

8. The power combiner of claim 7 wherein the output means further comprises an iris disposed in the aperture.

9. The power combiner of claim 6 wherein the walls and periphery of the cavity define a volume having a predetermined resonance, and the resonance controls the frequency band of oscillation of the oscillator circuits.

10. A microwave power combiner comprising:
a combining cavity defined by top and bottom walls and a periphery and having a central axis at the center of the periphery;
a plurality of coaxial oscillator circuits, each circuit comprising an oscillator diode and a coupling port coupled to the oscillator diode, the plurality disposed such that the coupling port of each oscillator circuit electrically couples with the cavity, and the individual coaxial oscillator circuits of the plurality are disposed such that adjacent oscillator circuits have their respective oscillator diode disposed in a different one of the top and bottom walls;
each coaxial oscillator circuit further comprising a predetermined length of coaxial line, the coaxial line having first and second sections, the first section having a larger outer dimension than the second section;
the respective oscillator diode is disposed in the first section; and
output means for conducting the power combined in the cavity out of the cavity.

11. A microwave power combiner comprising:
a fundamental mode central combining cavity defined by top and bottom walls and a periphery, and having a central axis at the center of the periphery;
at least three coaxial oscillator circuits, each having a predetermined length of coaxial line of one end of which is disposed a negative resistance oscillating diode and having a coupling port, the coupling port being disposed on an equi-potential line of the cavity and electrically coupling thereto, and the coaxial oscillator circuits being disposed in an alternating relationship to each other, wherein one coaxial oscillator circuit has its oscillating diode in the top wall while the next coaxial oscillator circuit on the equi-potential line has its oscillating diode in the bottom wall; and
the cavity having an output port for receiving the combined power of the plurality of coaxial oscillator circuits.

12. The power combiner of claim 11 wherein the negative resistance oscillating diode comprises an impact avalanche transit time (IMPATT) diode.

13. A microwave power combiner comprising:
a central combining cavity defined by top and bottom walls and a periphery, and having a central axis at the center of the periphery;
a plurality of coaxial oscillator circuits, each having a predetermined length of coaxial line at one end of which is disposed a negative resistance oscillating diode and having a coupling port, the coupling port being disposed on an equi-potential line of the cavity and electrically coupling thereto, and the coaxial oscillator circuits being disposed in an alternating relationship to each other, wherein one coaxial oscillator circuit has its oscillating diode in the top wall while the next coaxial oscillator circuit has its oscillating diode in the bottom wall;
the coaxial oscillator circuits further are disposed in relation to the cavity such that the central axes of the plurality of coaxial oscillator circuits are parallel to the central axis of the cavity;
the lengths of coaxial line each have first and second sections, the first section having a larger outer dimension than the second section;
the respective negative resistance oscillating diode is disposed in the first section; and
the cavity having an output port for receiving the combined power of the plurality of coaxial oscillator circuits.

14. The microwave power combiner of claim 13 wherein the top and bottom walls and the periphery define a volume having a predetermined resonance, and the resonance controls the frequency band of oscillation of the negative resistance oscillating circuits.

15. The power combiner of claim 14 wherein the central combining cavity is cylindrical in shape and the plurality of coaxial oscillator circuits are disposed around and electrically coupled to the periphery of the cavity.

16. The power combiner of claim 15 wherein the output port is centrally located in one of the walls of the cavity.

17. The power combiner of claim 14 wherein the cavity is rectangular in shape and the plurality of oscillator circuits are disposed on an equi-potential line of the cavity.

18. The power combiner of claim 17 wherein the output port comprises an aperture disposed in the periphery of the cavity.

19. The power combiner of claim 18 wherein the output port further comprises an iris disposed in the aperture.

20. A microwave power combiner comprising:
a central, generally square combining cavity defined by top and bottom walls and a periphery, the volume of which has a predetermined resonance, the cavity also having a central axis at the center of the periphery;

a plurality of coaxial oscillator circuits, each having a central axis, a linear length of coaxial line within which is disposed a negative resistance diode and a coupling port, the length of coaxial line having first and second sections, the first section having a larger outer dimension than the second section and the respective negative resistance diode is disposed in the first section, the coaxial oscillator circuit operative to generate power at a frequency band controlled by the predetermined resonance of the combining cavity, the oscillator circuits disposed on an equi-potential line of the cavity and electrically coupled thereto by means of the coupling port, the oscillator circuits also disposed so that their central axes are parallel to the central axis of the cavity, the oscillator circuits also disposed such that one oscillator circuit has the respective negative resistance diode in the top wall while the next coaxial oscillator circuit has the respective negative resistance diode in the bottom wall; and the cavity having an output port located in the periphery, for receiving the combined power of the negative resistance diodes and conducting the combined power out of the cavity.

* * * * *